United States Patent [19]

Nguyen et al.

[11] Patent Number: 4,987,102
[45] Date of Patent: Jan. 22, 1991

[54] PROCESS FOR FORMING HIGH PURITY THIN FILMS

[75] Inventors: Bich-Yen Nguyen, Austin; Jen-Jiang Lee, Plano; Hoang K. Nguyen, Austin; Young Limb, Austin; Philip J. Tobin, Austin, all of Tex.

[73] Assignee: Motorola, Inc., Schaumburg, Ill.

[21] Appl. No.: 445,220

[22] Filed: Dec. 4, 1989

[51] Int. Cl.⁵ .................. H01L 21/00; H01L 21/02; H01L 21/265; C23C 14/34
[52] U.S. Cl. .................. 437/238; 437/18; 437/225; 437/228; 437/235; 437/38; 437/39; 118/50.1; 118/620
[58] Field of Search .............. 437/16, 18, 20, 225, 437/228, 235, 238; 427/38, 39; 118/50.1, 620; 204/192.12, 192.15, 192.22, 192.23

[56] References Cited

U.S. PATENT DOCUMENTS

| | | | |
|---|---|---|---|
| 3,916,034 | 10/1975 | Tsuchimoto | 437/925 |
| 4,523,971 | 6/1985 | Cuomo et al. | 118/620 |
| 4,540,466 | 9/1985 | Nishizawa | 118/620 |
| 4,599,135 | 7/1986 | Tsunekawa et al. | 118/620 |
| 4,624,859 | 11/1986 | Akira et al. | 437/18 |
| 4,664,747 | 5/1987 | Sekiguchi et al. | 118/50.1 |
| 4,795,529 | 1/1989 | Kawasaki et al. | 118/50.1 |
| 4,800,100 | 1/1989 | Herbots et al. | 118/50.1 |
| 4,870,030 | 9/1989 | Markunas et al. | 437/18 |
| 4,916,091 | 4/1990 | Freeman et al. | 437/228 |
| 4,947,085 | 8/1990 | Nakanishi et al. | 118/50.1 |
| 4,950,642 | 8/1990 | Okamoto et al. | 427/39 |
| 4,952,273 | 8/1990 | Popov | 118/50.1 |

FOREIGN PATENT DOCUMENTS

| | | | |
|---|---|---|---|
| 2811414 | 9/1978 | Fed. Rep. of Germany | 437/18 |
| 3839903 | 6/1989 | Fed. Rep. of Germany | 427/38 |
| 0202942 | 10/1985 | Japan | 427/38 |
| 1201772 | 9/1986 | Japan | 427/38 |
| 1108381 | 4/1989 | Japan | 427/38 |
| 2131226 | 6/1984 | United Kingdom | 427/38 |

Primary Examiner—Brian E. Hearn
Assistant Examiner—B. Everhart
Attorney, Agent, or Firm—Jasper W. Dockrey

[57] ABSTRACT

A method is described for the formation of high purity thin films on a semiconductor substrate. In the preferred embodiment of the invention a thin film is formed on a semiconductor substrate in a plasma enhanced chemical vapor deposition system. Energized silicon ions are obtained by mass analysis and are accelerated into a hydrogen-free plasma. A reaction occurs between energized atoms within the plasma and the energized silicon ions resulting in the deposition of a thin film on the semiconductor substrate.

20 Claims, 1 Drawing Sheet

PROCESS FOR FORMING HIGH PURITY THIN FILMS

BACKGROUND OF THE INVENTION

This invention relates in general to a process for depositing thin films in the fabrication of semiconductor devices and more specifically to a process for depositing high purity dielectric and passivation thin films on a semiconductor substrate.

The processing of semiconductor devices often requires the deposition of dielectric and passivation films. The dielectric and pasivation films are used to electrically isolate two or more conductive layers from each other and from a conductive substrate. Integrated circuits often use insulated gate field effect transistors (IGFETs) having a conducting gate electrically isolated from a semiconductor substrate by a thin dielectric material. For instance, in CMOS semiconductor devices this conducting gate may be polycrystalline silicon (polysilicon) overlying a silicon oxide dielectric. Dielectrics are also used in capacitors, such as for DRAM memories, and to separate first and second polysilicon layers overlying a semiconductor substrate. As integrated circuits have been scaled down to accommodate ever increasing densities of semiconductor devices a corresponding decrease in dielectric film thickness is necessary. The reduction of film thickness into the range of 100 angstroms or less has reduced the acceptable defect tolerance level of these films. The VLSI environment in which the dielectric films must function requires that these films be of high dielectric strength, have a high breakdown voltage, be radiation resistant, and provide a diffusion barrier to contaminants such as sodium and dopants used to adjust the electrical conductivity of adjacent conductive layers.

In the case of VLSI MOS device fabrication, the dielectric and insulating films are commonly composed of silicon dioxide or silicon nitride, dielectric films can also be composed of a composite structure consisting of oxide-nitride-oxide (ONO). Silicon nitride, in addition to having suitable dielectric properties is an excellent barrier to sodium diffusion. The diffusion barrier property of silicon nitride has increased the application of this material for use as a dielectric structure in semiconductor devices both singularly and in combination with silicon dioxide.

Silicon nitride for application as a dielectric or a passivation material can be deposited by reacting silane with ammonia at a temperature of about 700 to 900 degrees centigrade in an atmospheric pressure chemical vapor deposition (CVD) reactor. For example, silicon nitride is formed according to the following reaction,

$$3SiH_4 + 4NH_3 \rightarrow Si_3N_4 + 12H_2 \tag{1}$$

A more uniform nitride deposition on a given substrate may be obtained by the reaction of dichlorosilane with ammonia at a reduced pressure (0.25 to 2.0 torr) and a temperature range of 700 to 800 degrees centigrade. For example, silicon nitride is formed at low pressure according to the reaction,

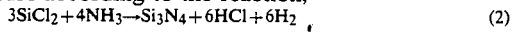

$$3SiCl_2 + 4NH_3 \rightarrow Si_3N_4 + 6HCl + 6H_2 \tag{2}$$

The formation of a high quality film by either CVD or low pressure CVD (LPCVD) requires that the constituents be incorporated in the film in approximately stoichiometric proportions. However, excess ammonia is normally used in order to avoid the formation of a silicon-rich nitride film. The incorporation of excess silicon in the nitride film has the deleterious effect of reducing electrical resistance of the silicon nitride thereby diminishing its dielectric properties. The introduction of excess ammonia in the reactor is effective in preventing the incorporation of excess silicon in the silicon nitride film, however, the use of excess ammonia results in the formation of a silicon nitride film which can have a hydrogen content of up to about 8 gram-atomic %. The presence of hydrogen is undesirable because hydrogen enhances the diffusion of contaminants into and through the silicon nitride dielectric.

A similar contamination problem occurs when a silicon dioxide film is deposited in and LPCVD reactor. For example, a silicon dioxide film is formed by reacting silane with oxygen at about 400 to 500 degrees centigrade according to the reaction,

$$SiH_4 + O_2 \rightarrow SiO_2 + 2H_2 \tag{3}$$

Alternatively, silicon dioxide may be formed in an LPCVD reactor by the reaction of dichlorosilane with nitrous oxide at about 900 degrees centigrade according to the reaction,

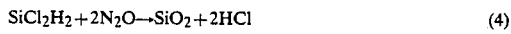

$$SiCl_2H_2 + 2N_2O \rightarrow SiO_2 + 2HCl \tag{4}$$

The formation of a silicon dioxide film by LPCVD deposition yields a film containing silicon hydroxide (SiOH) in the range of about 1 to 4 weight percent. As in the case of silicon nitride, the presence of hydrogen in the silicon dioxide results in an enhancement of the films ability to transport contaminants.

From the foregoing it is apparent that all of the methods described above yield a hydrogenated film. The presence of hydrogen seriously compromises the sodium barrier characteristics of a nitride film and leads to the inclusion of contaminants in a silicon dioxide film. The deleterious effects of contamination induced defects in dielectric and passivation films used in semiconductor devices is well known in the semiconductor process sciences. Defects form interface charge traps which can shift the threshold voltage of an MOS transistor and reduce the charge storage capability of a DRAM capacitor. VLSI devices can incur serious reliability problems due to the presence of interface states originating from contamination in a dielectric film. Accordingly, a need existed for a method of producing contamination free dielectric and passivation films for use in semiconductor device fabrication.

BRIEF SUMMARY OF THE INVENTION

An object of the invention is to provide an improved thin film for use in a semiconductor device.

Another object of the invention is to provide an improved method for forming a high purity thin film on a semiconductor substrate.

Accordingly, these and other objects and advantages of the invention are carried out in one embodiment in a process using a vacuum chamber in which a semiconductor substrate is supported on a grounded electrode enclosed within the vacuum chamber. A hydrogen-free gas is energized by RF energy coupled to a powered electrode within the vacuum chamber. An energized silicon containing gas is mass analyzed to obtain energized silicon ions which are introduced into the vacuum chamber. A reaction then takes place between the excited atoms within the energized hydrogen-free gas and the silicon ions to form a thin film on the semiconductor substrate.

DETAILED DESCRIPTION OF THE PREFERRED EMBODIMENTS

Figure 1:
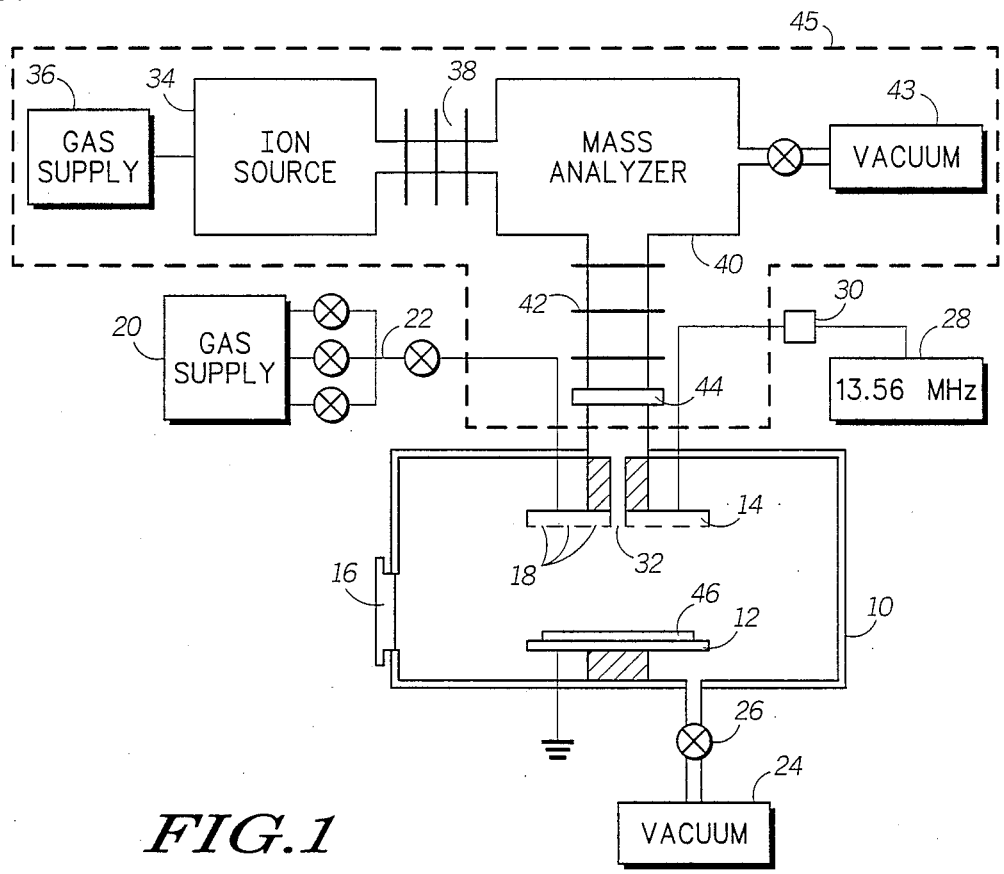
FIG. 1, is a combination schematic and cross sectional view of an apparatus for performing the process of the present invention in accordance with a preferred embodiment.

Shown in FIG. 1 is a composite cross-sectional schematic diagram of a modified plasma enhanced chemical vapor deposition (PECVD) system suitable for use in practicing the present invention. The apparatus comprises a vacuum chamber 10 which encloses a lower grounded electrode 12 and an upper powered electrode 14. Wafers to be processed are loaded into vacuum chamber 10 by means of an access door 16 and placed upon grounded electrode 12. Processed wafers are removed from vacuum chamber 10 also by means of access door 16.

Inside chamber 10 electrodes 12 and 14 have generally planar surfaces and are parallel to one another. Both grounded electrode 12 and powered electrode 14 are electrically insulated from the walls of chamber 10. Powered electrode 14 is adapted to dispense process gasses into the space between the two electrodes through a plurality of openings 18 in the lower surface of the electrode. A first gas supply 20 and flow control apparatus 22 is coupled to electrode 14 in order to select and regulate the flow of gases to chamber 10. A vacuum system 24 is coupled through a pressure control valve 26 to chamber 10 to control the pressure therein and remove excess gaseous reaction products therefrom.

The gases introduced to chamber 10 are energized by means of a 13.56 MHz power supply 28 coupled to electrode 14 through a matching network and blocking capacitor unit 30. The components described thusfar will be recognized by those skilled in the art as comprising a plasma deposition system. Gases introduced into the space between the two electrodes are excited to a high energy state by the RF energy emitted from power supply 28.

According to the preferred embodiment of the invention, an ion wave guide 32 traverses through a center portion of electrode 14 to dispense energetic ions into the space between the two electrodes. Ions are supplied by a Freeman-type ion source 34 which accepts a source gas from a second gas supply 36. An extraction electrode assembly draws the ions produced by ion source 34 out of the source and propels them to a mass analyzer 40. Mass analyzer 40 is adjustable by varying the magnetic strength of the analyzer to allow the passage of ions of a predetermined mass. The mass-analyzed ions selected by mass analyzer 40, upon exiting the mass analyzer, are accelerated by an acceleraton column 42 connected to wave guide 32. The mass-analyzed ions are thus propelled into the space between the two electrodes in chamber 10. The pressure within mass analyzer 40 and acceleration column 42 is controlled by vacuum system 43. An ion beam gate 44 located in accelerator column 42 shutters the flow of ions to chamber 10. Those skilled in the art will recognize the ion supplying components as comprising a portion of the functional components of an ion implantation system. The components 32, 34,36,38,40,42, and 44 comprise an ion delivery system 45. The internal pressure within accceleratin column 42 and vacuum chamber 10 is independently controlled by vacuum system 43 and 24 respectively. In the open position, beam gate 44 assists in regulating the pressure differential between acceleration column 42 and vacuum chamber 10 via a series of apertures located on beam gate 44. The apertures vary in size from about 500 to 800 microns and are selected depending upon deposition conditions.

In operation, a semiconductor substrate 46, which has been prepared to receive a thin film is placed on grounded electrode 12. Door 16 is closed and vacuum system 24 removes the atmosphere from chamber 10. Once the internal pressure is set at a level selected for optimum operation, gas supply 20 and flow control apparatus 22 are activated to introduce process gases to chamber 10. Power supply 28 is activated at a level selected for optimum operation to impart RF powerr to electrode 14, thus igniting a plasma in the space between the two electrodes. Ion beam gate 44 is opened and energized ions are accelerated, by accelerator column 42, into the plasma confined to the space between the two electrodes. A chemical reaction then takes place in the plasma, and more specifically in the immediate vicinity of substrate 46, resulting in the deposition of a thin film onto substrate 46. After a predetermined time, beam gate 44 is closed, power supply 28 is shut off, and chamber 10 is back-filled with an inert gas from gas supply 20 until the internal pressure is equalized to atmospheric pressure. Semiconductor substrate 46 is then removed from grounded electrode 12 through door 16.

In a preferred embodiment of the invention, a hydrogen-free silicon nitride film is formed on semiconductor substrate 46 at a chamber pressure of about 10 millitorr by the reaction of nitrogen and energetic silicon ions. A nitrogen plasma is formed in the space between the two electrodes in chamber 10 by supplyig elemental nitrogen gas to chamber 10 from gas supply 20 at a flow rate of about 50 SCCM and energizing the nitrogen by activating power supply 28 to deliver about 300 watts of RF power to electrode 14. The energetic silicon ions are produced by ion delivery system 45 by feeding a source gas such as silane, silicon tetrafluoride, silicon tetrachloride or the like from gas supply 36 to ion source 34. Optionally, as is well known in the art, a solid source material such as solid silicon can be heated under high vacuum to supply an ionizable gas to ion source 34. Singly charged silicon ions having a mass of 28 atomic mass units (AMU) are selected from the ions beam emerging from extraction electrode assembly 38 by mass analyzer 40. Mass analyzer 40 can be any type of mass analyzer capable of analyzing energetic ions, for example a 90 degree magnetic analyzer. Optionally a cross-pole XY analyzer can also be used. For purposes of illustrating one embodiment of the invention, mass analyzer 40 is a 90 degree analyzer having a magnetic field strength H (in kilogauss) determined by the relationship, $$H = k(m)^{\frac{1}{2}} \qquad (5)$$

where k is a constant for a give ion energy, radius of magnet curvature, and ionic charge. The term m in equation (5) represents the ion mass (in AMU) of ions that will exit the analyzer for a given magnetic field strength H. In operation, an electrical current is passed through conductive wiring coiled around the 90 degree magnet producing a magnetic field strength sufficient to satisfy equation (5) for singly charged silicon ions having a mass of 28 AMU.

Silicon ions emerging from mass analyzer 40 are accelerated by accelerator column 42 to energy of about 5 to 10 KeV and propelled into chamber 10 through wave guide 32. Ion delivery system 45 produces an ion current of about 50 to 100 milliamperes and imparts an areal density of about $10^{16}$ to $10^{17}$ ions per square centimeter to the nitrogen plasma. The reaction occurring in the plasma and in the immediate vicinity of substrate 46 may be expressed as, $$3Si^* + 4N^* \rightarrow Si_3N_4 \tag{6}$$

where * designates an energized atom or ion. Reaction (6) results in a linear film deposition rate of approximately 5 to 35 angstroms per minute on substrate 46 and proceeds at the temperature of the nitrogen plasma which is in the range of 250 to 400 degrees centigrade.

The method of formation of silicon nitride described above and illustrated by reaction (6) is an improvement over the prior art method of forming silicon nitride in that the reactants provided for the reaction occurring in chamber 10 are hydrogen-free. An additional advantage of the present invention is that a nitride film is formed at a temperature substantially less than the 700 to 900 degree centigrade range of previous methods. As would be apparent to one skilled in the art other types of films and other film compositions may be formed with the method of the present invention. In a similar manner a hydrogen-free silicon dioxide film is formed on substrate 46, at a chamber pressure of about 10 millitorr, by the reaction of oxygen and energetic silicon ions. Elemental oxygen gas is supplied to chamber 10 from gas supply 20 at a flow rate of about 50 SCCM and mass analyzed silicon ions are supplied through wave guide 32 by the ion delivery system 45 at a rate of about 50 to 100 milliamperes. The reaction occurring in the space between the two electrodes and in the immediate vicinity of substrate 46 may then be expressed as, $$Si^* + 2O^* \rightarrow SiO_2 \tag{7}$$

where * again designates an energized atom or ion.

Figure 2:
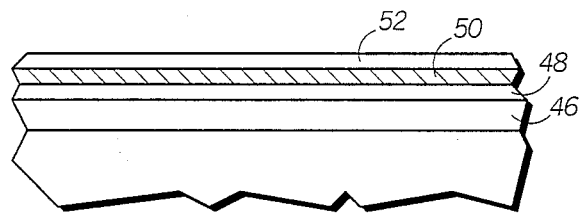
FIG. 2, illustrates in cross section, a portion of a semiconductor substrate having undergone some of the process steps in accordance with the invention.

The thin film formation methods illustrated by reactins (6) and (7) may be carried out sequentially resulting in the deposition of a composite oxide-nitride-oxide (ONO) film on substrate 46. For example, the method of reaction (7) is carried out to form a layer of silicon dioxide 48 on substrate 46 having a thickness of approximatley 1 to 10 nanometers as shown in FIG. 2. The reaction is terminated by closing ion gate 44 and shuttig off power supply 28. Chamber 10 is then evacuated to purge oxygen from the chamber and nitrogen is introduced followed by the resumption of silicon ion current and RF power. The method of reaction (6) is then carried out to form a layer of silicon nitride 50 overlying silicon dioxide layer 48. Following the deposition of layer 50, chamber 10 is again evacuated and oxygen is reintroduced and the method of reaction (7) is carried out to form a second silicon dioxide layer 52 overlying silicon nitride layer 50 as shown in FIG. 2. Alternatively, oxide layer 48 may be deposited by conventional chemical vapor deposition or thermally grown from substrate 46.

Other hydrogen-free gases may be used to form silicon nitride and silicon dioxide films and are contemplated by the present invention. For example, nitrous oxide ($N_2O$) will react with silicon to form a hydrogen-free silicon dioxide film according to the reaction, $$Si^* + 2N_2O^* \rightarrow SiO_2 + 2N_2 \tag{8}$$

a similar reaction will occur using nitric oxide (NO) in the place of nitrous oxide. An oxynitride dielectric film is formed by the reaction of Si* and N* simultaneously with $N_2O$.

It will also be apparent to one skilled in the art that the deposition of doped silicon dioxide films can be realized by the inclusion of a dopant containing gas such as boron trifluoride ($BF_3$) from gas supply 20. In addition, other types of passivation films can be formed by the method of the present invention for example, aluminum nitride (AlN) can be formed by generating a nitrogen plasma in the space between electrodes 12 and 14 and introducing mass-analyzed Al ions from ion delivery system 45. Furthermore, titanium dioxide ($TiO_2$) and tantalum pentaoxide ($Ta_2O_5$) can be formed by the introduction of mass analyzed Ti or Ta ions into an oxygen plasma. Titanium ions can be formed in ion delivery system 45 by introducing titanium tetrachloride ($TiCl_4$) into ion source 34 from gas supply 36. Tantalum ions are formed in a similar manner by supplying tantalum chloride ($TaCl_5$) from gas supply 36.

The inventive method of mass analyzing an energized gas to obtain an elemental species for participation in a chemical vapor deposition reaction can be extended to include the use of multiple ion delivery systems coupled to vacuum chamber 10. For example, a boro-phosphorus silicate glass (BPSG) film can be formed by energizing a $BF_3$ containing oxygen plasma and introducing energized silicon ions from a first ion delivery system and energized phosphorus ions from a second ion delivery system.

Thus it is apparent that there has been provided, in accordance with the invention, a method for forming a high purity film which fully meets the objects and advantages set forth above. Although the invention has been described and illustrated with reference to specific illustrative embodiments thereof, it is not intended that the invention to be limited to those illustrative embodiments. Those skilled in the art will recognize that variations and modifications can be made without departing from the spirit of the invention. For example, a gas manifold system can be used to dispense gases into the vacuum chamber. Additionally, the substrate temperature may be controlled in the range from 25 degress centigrade to plasma temperature (250-400 degrees centigrade) by means of a cooling element placed in the grounded electrode. Alternatively, a gas such as silicon tetrachloride or silicon tetrafluoride may be introduced to the chamber and nitrogen ions accelerated into the plasma by means of the ion delivery system thus forming a nitride film on the substrate. Moreover, a conductive film such as titanium nitride (TiN) can be formed by introducing mass analyzed Ti into a nitrogen plasma. It is therefore intended to include within the invention all such variations and modifications as fall within the scope of the appended claims.

We claim:

1. A method for forming a thin film on a semiconductor substrate comprising the steps of:
   supporting the substrate on a grounded electrode enclosed within a vacuum chamber;
   introducing a first gas into said vacuum chamber;
   energizing said first gas with RF energy coupled to a powered electrode enclosed within said vacuum chamber;
   mass analyzing a second gas to obtain energized ions; and
   introducing said enrgized ions into said vacuum chamber to react with said energized first gas to form said thin film on said substrate.

2. The method of claim 1 wherein said ions have an energy in the range of 5 to 10 KeV and an areal density imparted to said plasma of about $10^{16}$ to $10^{17}$ ions per square centimeter.

3. The method of claim 1 wherein said RF energy has a frequency of approximately 13.56 MHz.

4. The method of claim 3 wherein a first gas pressure is maintained in said vacuum chamber at approximately 1 to 10 millitorr.

5. The method of claim 1 wherein the substrate is maintained at a temperature of about 25 to 400 degrees centigrade on said electrode.

6. The method of claim 1 wherein said second gas is selected from the group consisting of silane, silicon tetrachloride, silicon tetrafluoride, silicon and said first gas is oxygen and said thin film is silicon oxide.

7. The method of claim 1 wherein said second gas is selected from the group consisting of silane, silicon tetrachloride, silicon tetrafluoride, silicon and said first gas is nitrogen and said thin film is silicon nitride.

8. The method of claim 1 wherein said second gas is titanium tetrachloride and said first gas is oxygen and said thin film is titanium pentaoxide.

9. The method of claim 1 wherein said second gas is tantalum trichloride and said first gas is oxygen and said thin film is tantalum dioxide.

10. The method of claim 1 wherein said second gas is titanium tetrachloride and said first gas is nitorgen and said thin film is titanium nitride.

11. The method of claim 1 wherein said second gas is selected from the group consisting of aluminum chloride and aluminum and said first gas is nitrogen and said thin film is aluminum nitride.

12. A method for forming a hydrogen-free dielectric film on a semiconductor substrate, said dielectric film comprising a first element obtained from an energized reactive species within a plasma and a second element obtained from a reactive ion species comprising:
    supporting the substrate on a grounded electrode enclosed within a vacuum chamber;
    energizing a hydrogen-free reactive gaseous species in said vacuum chamber with RF energy coupled to a powered electrode to form a plasma;
    mass analyzing an energized gas to obtain energized ions; and
    introducing said energized ions into said vacuum chamber to react with an energized reactive species within said plasma to form said hydrogen-free dielectric film on said substrate.

13. The method of claim 12 wherein said energized gas is selected from the group consistig of silane, silicon tetrachloride, and silicon tetrafluoride.

14. The method of claim 13 wherein said energized ions are silicon and said hydrogen-free reactive gas is selected from the group consisting of nitrogen, oxygen, and nitrous oxide.

15. A method for forming a hydrogen-free ONO dielectric film on a semiconductor substrate comprising a first silicon dioxide layer, a silicon nitride layer, and a second silicon dioxide layer using a reactive gaseous species and a reactive ion species comprising:
    supporting said substrate on a lower electrode enclosed within a vacuum chamber;
    energizing oxygen gas with RF energy coupled to a powered electrode enclosed within said vacuum chamber to form an oxygen plasma;
    mass analyzing an energized silicon-containing gas to obtain energized silicon ions;
    introducing said energized silicon ions into said vacuum chamber to react with energized oxygen atoms within said oxygen plasma to form said first silicon dioxide layer on said substrate;
    purging said oxygen gas and introducing nitrogen gas into said vacuum chamber;
    subsequently, energizing said nitrogen gas in said vacuum chamber with RF energy coupled to said powered electrode to form a nitrogen plasma
    mass analyzing said energized silicon-containing gas to obtain said energized silicon ions;
    introducing said energized silicon ions into said vacuum chamber to react with energized nitrogen atoms within said nitrogen plasma to form said silicon nitride layer overlying said first silicon dioxide layer;
    purging said nitrogen gas and re-introducing said oxygen gas into said vacuum chamber;
    subsequently, energizing said re-introduced oxygen gas in said vacuum chamber with RF energy coupled to said powered electrode to form said oxygen plasma plasma;
    mass analyzing said energized silicon-containing gas to obtain said energized silicon ions; and
    introducing said energized silicon ions into said vacuum chamber to react with said energized oxygen atoms within said oxygen plasma to form said second silicon dioxide layer overlying said silicon nitride layer.

16. The method of claim 15 wherein said RF energy has a frequency of approximately 13.56 MHz.

17. The method of claim 16 wherein a hydrogen-free gas pressure is maintained in said reaction chamber at approximately 1 to 10 millitorr.

18. The method of claim 17 wherein said energized silicon-containing gas is selected from the group consisting of silane, silicon tetrachloride, and silicon tetrafluoride.

19. A method for forming a passivation film on a semiconductor substrate, comprising:
    supporting the substrate on a grounded electrode enclosed within a vacuum chamber;
    energizing a reactive gaseous species in said vacuum chamber with RF energy coupled to a powered electrode to form a plasma;
    mass analyzing an energized gas to obtain energized ions; and
    introducing said energized ions into said vacuum chamber to react with an energized reactive species within said plasma to form said hyrdrogen-free dielectric film on said substrate.

20. The method of claim 19 wherein said energized ions are selected from the group consisting of aluminum and silicon, and said reactive gas is selected from the group consisting of nitrogen, oxygen, and nitrous oxide.

* * * * *

UNITED STATES PATENT AND TRADEMARK OFFICE
CERTIFICATE OF CORRECTION

PATENT NO. : 4,987,102

DATED : Jan. 22, 1991

INVENTOR(S) : Bich-Yen Nguyen, Hoang Khac Nguyen, Young Limb, Philip J. Tobin, Jen-Jiang Lee It is certified that error appears in the above-identified patent and that said Letters Patent is hereby corrected as shown below:

Column 7, Line 42, change "nitorgen" to --nitrogen--.

Signed and Sealed this

Nineteenth Day of May, 1992

Attest:

DOUGLAS B. COMER

*Attesting Officer*  *Acting Commissioner of Patents and Trademarks*